US012810959B2

(12) United States Patent
Ayyapureddi et al.

(10) Patent No.: US 12,810,959 B2
(45) Date of Patent: Nov. 24, 2026

(54) APPARATUSES AND METHODS FOR REDUNDANCY INFORMATION FOR MEMORY WITH MULTIPLE STORAGE MODES

(71) Applicant: Micron Technology, Inc., Boise, ID (US)

(72) Inventors: Sujeet Ayyapureddi, Boise, ID (US); Gary Howe, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 18/976,018

(22) Filed: Dec. 10, 2024

(65) Prior Publication Data

US 2026/0162756 A1 Jun. 11, 2026

(51) Int. Cl.
*G11C 29/00* (2006.01)

(52) U.S. Cl.
CPC .................................... *G11C 29/76* (2013.01)

(58) Field of Classification Search
CPC ...................................................... G11C 29/76
See application file for complete search history.

(56) References Cited

U.S. PATENT DOCUMENTS

2007/0242551 A1* 10/2007 Johnson ............... G11C 7/1045 365/230.02
2015/0162911 A1 6/2015 Byeon
2017/0133108 A1* 5/2017 Lee ........................ G11C 29/78
2018/0019024 A1 1/2018 Shim
2021/0043269 A1 2/2021 He
2021/0357287 A1 11/2021 Kim et al.
2024/0272979 A1 8/2024 Ayyapureddi

OTHER PUBLICATIONS

PCT Application No. PCT/US25/58937 titled "Apparatuses and Methods for Redundancy Information for Memory With Multiple Storage Modes" filed Dec. 10, 2025, pp. all pages of the application as filed.

* cited by examiner

*Primary Examiner* — Xiaochun L Chen
(74) *Attorney, Agent, or Firm* — Dorsey & Whitney LLP

(57) ABSTRACT

A memory device may have multiple storage modes. The memory array may be arranged differently for the storage modes. For the storage modes, the memory device may store information to correctly map logical addresses to physical memory locations that have been repaired. In some examples, additional fuses storing addresses for the storage modes are included. In some examples, additional fuses encoding address shift information are included. In some examples, a mode register write may initiate a broadcast operation to provide mapping information for the different storage modes. In some examples, the memory device may include additional logic circuits for shifting the addresses for the different storage modes.

20 Claims, 12 Drawing Sheets

600

| 3 | 2 | 1 | 0 | Shift |
|---|---|---|---|---|
| 0 | 1 | 0 | 0 | X,0 |
| 1 | 0 | 1 | 1 | Y,Z |

2nd Mode (bits 3, 2) | 1st Mode (bits 1, 0)

602

| 1 | 0 | Shift |
|---|---|---|
| 0 | 0 | No Shift |
| 0 | 1 | X Bits |
| 1 | 0 | Y Bits |
| 1 | 1 | Z Bits |

FIG. 6

APPARATUSES AND METHODS FOR REDUNDANCY INFORMATION FOR MEMORY WITH MULTIPLE STORAGE MODES

BACKGROUND

Memory devices, such as dynamic random-access memory (DRAM), include an array of memory cells that may be organized into rows (word lines) and columns (bit lines). Information may be stored in the memory cells, typically as single bit of information as either a logical high (e.g., a "1") or a logical low (e.g., a "0"). Various types of information may be stored in the array, such as data, error correction code (ECC) data, and metadata. The data may be information provided by an external device (e.g., controller, processor, host system). The ECC data may provide information that may be used to detect and/or correct errors in the data. The metadata may provide information about the data, ECC data, the memory device, and/or a device in communication with the memory device (e.g., a controller).

DRAM users are increasingly using metadata to supplement the data stored in the memory array. However, not all DRAM users utilize metadata, and DRAM users may vary on how much of the memory array they want to dedicate to memory devices. Accordingly, memory devices may accommodate metadata storage modes and non-metadata storage modes, for example, as described in U.S. Provisional Patent Application Nos. 63/695,446, 63/695,458, 63/695,465, 63/695,472, 63/695,482, and 63/695,495 filed Sep. 17, 2024, which are incorporated herein by reference for any purpose. Further, some memory devices may accommodate multiple metadata storage modes in addition to a non-metadata storage mode as described in U.S. patent application Ser. No. 18/916,497 and Ser. No. 18/916,521 filed Oct. 15, 2024, which are incorporated herein by reference for any purpose.

At various points in manufacturing and use of a memory device, one or more memory cells may fail (e.g., become unable to store information, be inaccessible by the memory device, etc.) and may need to be repaired. The memory device may perform repair operations on a row-by-row basis and/or column-by-column basis. For example, during a column repair operation, a column containing a failed memory cell (which may be referred to as a defective column or a bad column) may be identified. The memory device may contain an additional column of memory (which may also be referred to as redundant column) which may be used in repair operations. During a repair operation, a column address associated with the defective column may be redirected (e.g., remapped), such that the column address points to a redundant column instead. These repair operations are typically implemented as broadcast operations where information on remapped rows and columns are transmitted to peripheral circuits of the memory array from a fuse array where repair information is stored.

BRIEF DESCRIPTION OF THE DRAWINGS

Non-limiting and non-exhaustive examples are described with reference to the following Figures. The elements of the drawings are not necessarily to scale relative to each other.

FIG. 6 illustrates tables for encoding an address shift in fuses in accordance with some embodiments of the present disclosure.

DETAILED DESCRIPTION

Figure 1:
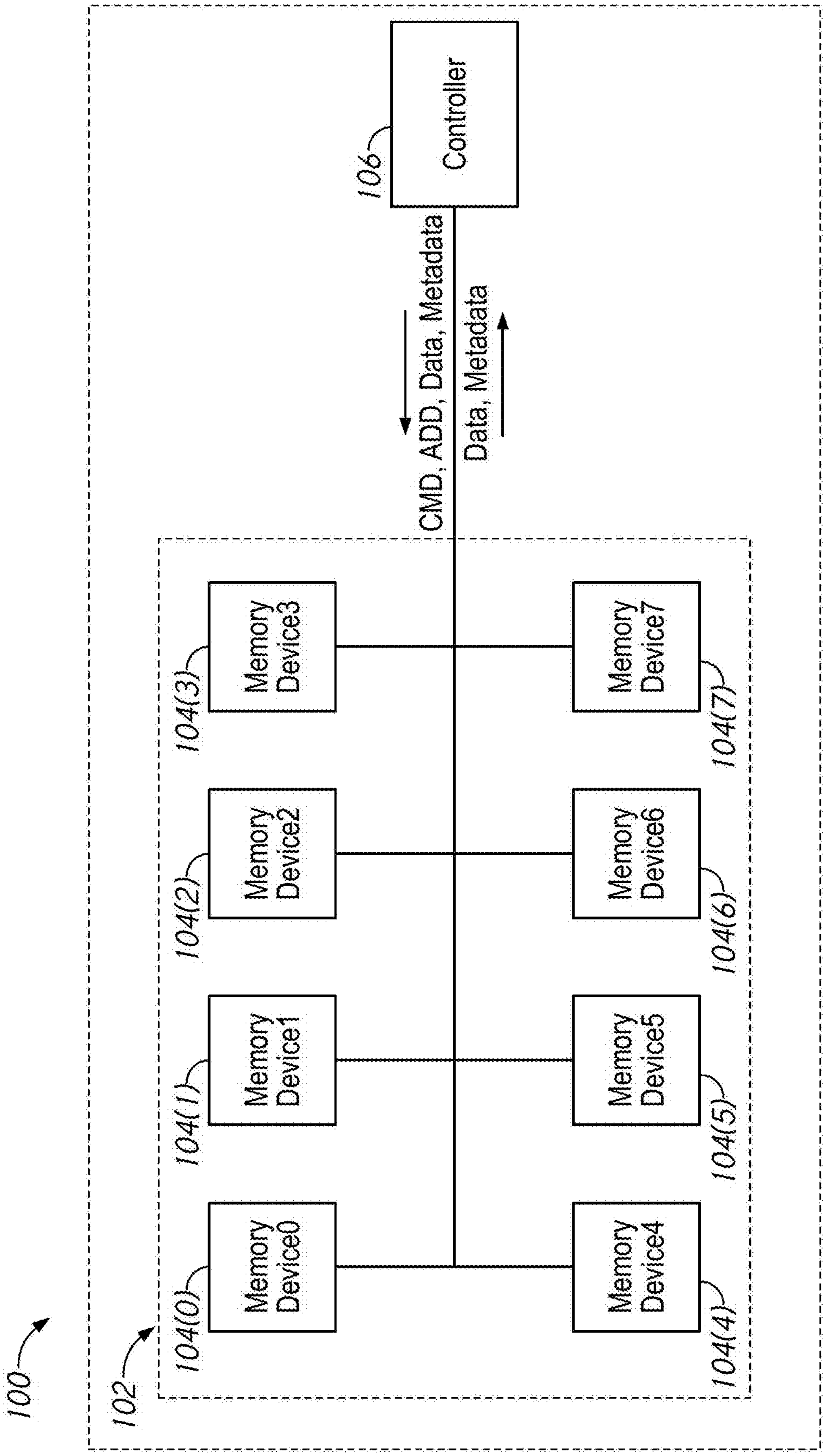
FIG. 1 is a block diagram of at least a portion of a computing system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized, and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in multiple memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns) an array. The memory may further be organized into one or more memory banks. The banks may be organized into bank groups, where each bank group includes one or more banks. Each bank may include multiple of rows and columns. During operations, the memory device may receive a command and an address which specifies one or more rows and one or more columns and then execute the command on the memory cells at the intersection of the specified rows and columns (and/or along an entire row/column). The address may further specify the bank group and/or bank for execution of the command. In some applications, rows may be specified by 17-bit row addresses and columns may be specified by 12-bit column addresses. However, the number of bits used for the addresses may vary depending on the size and/or organization of the memory.

The columns may generally be organized into column planes, each of which includes a number of sets of individual columns all activated by a column select signal (CS) (e.g., column selects). Each bank may include some number X column planes. A column plane may receive some number N of column select (CS) signals, each of which may activate some number M of individual bit lines. As used herein, a column select set or CS set may generally refer to a set of bit lines which are activated by a given value of the CS signal within a column plane. The column select signal may be represented by (all or a portion of) a column address (CA). For example, a portion of the CA may indicate a column plane, and another portion of the CA may indicate the column select. Responsive to a column select signal, data may be provided from corresponding locations from the column planes. The data from the column planes associated with the column select signal may be referred to as a prefetch.

Certain memory cells may be defective, and memory lines (e.g., rows or columns) containing one or more defective memory cells may generally be referred to as defective lines or bad lines (e.g., defective/bad rows or columns). The defective lines may be incapable of storing information and/or may become otherwise inaccessible to the memory device. The memory device may carry out one or more types of repair operations to resolve the defective lines, which may be done on a line-by-line basis (e.g., a row-by-row basis and/or a column-by-column basis), or in some embodiments of the disclosure, in groups of lines.

Memory banks may generally include a number of additional memory lines, which may generally be referred to as redundant lines (e.g., redundant rows and/or redundant columns). The redundant lines may be organized in various ways. For example, a memory bank may be organized into a number of column planes (e.g., 16-19 column planes). Each column plane may include one or more redundant column select available for repairing a bad column in the plane in which the redundant column select is located. This may be referred to as local column redundancy (LCR).

In another example, a memory bank may be organized into a number of column planes, and one column plane is dedicated to redundant column selects. The redundant column selects in this plane may be available to repair bad columns in any of the other column planes. In some cases, this plane may include fewer column selects than the "regular" column planes (e.g., 16 instead of 64). This may be referred to as global column redundancy, and the plane with the redundant column selects may be referred to as the global column redundancy (GCR) plane. Whether LCR or GCR is selected may be based on various factors. For example, LCR may require additional die space, but GCR may require providing additional repair data to the GCR plane.

During a repair operation, a memory line address (e.g., a row and/or column address) associated with a defective line may be redirected so that it is associated with one of the redundant lines instead. In some modes of operation, the repair operation may be a hard (or permanent) repair operation, where updated memory line address information is stored in the memory in a non-volatile form (e.g., stored in a manner that is maintained even when the memory device is powered down). For example, the memory device may include a fuse array, which may include fuses (and/or anti-fuses), each of which may have a state that can be permanently changed (e.g., when the fuse/anti-fuse is "blown"). The state of the fuses/anti-fuses in the fuse array may, in part, determine which addresses are associated with which lines of memory. In some applications, the fuse array is provided at the bank level (e.g., fuse banks). In other applications, the fuse array is provided external to the memory banks, and repair information is "broadcast" to the banks during a broadcast operation. The memory banks may include latches, registers, and/or other logic for storing and utilizing the repair operation to remap defective memory lines to redundant lines in the banks.

As discussed in the Background section, memory devices may have different operation modes where different amounts of metadata are stored (e.g., different storage modes). For example, a memory device may have two modes: MD ON (metadata is stored) and MD OFF (metadata is not stored). In another example, a memory device may have three modes: MD16 ON (16 bits of metadata prefetch line are stored), MD8 ON (8 bits of metadata per prefetch are stored), and MD OFF (no metadata is stored). The arrangement of the memory array of the memory device may change based on the storage mode. For example, the organization of the column planes and/or addressing of the column select signals may change based on the selected storage mode. That is, the physical to logical address mapping of the memory array may change. For example, a column select may be associated with a first column plane in one storage mode and a second column plane in a different storage mode. This may change the address associated with the column select.

Altering the addresses of the column selects may also cause the addresses of the column selects that need to be remapped to redundant column selects to change. If the repair address information is not updated, the wrong addresses may be remapped. This may cause some addresses may be mapped to defective columns. This could lead to data loss and/or other errors. Accordingly, to maintain the ability of the memory device to repair defective rows and columns, the redundancy components must also be capable of supporting multiple storage modes.

According to embodiments of the present disclosure, fuses may be added to the fuse array such that separate redundancy information is stored for each storage mode. The redundancy information may include address information (e.g., column address) for memory lines remapped to redundant memory lines. A command from a controller, a setting in a mode register, and/or information stored in additional fuses may indicate which storage mode is selected. Based on the selected storage mode, the appropriate redundancy information in the fuse array is broadcast to the banks. However, this solution may require a significant number of additional fuses. If there are two storage modes, the number of required fuses may be doubled. For three storage modes, the number required may be tripled. These additional fuses may increase the required die size. For example, in some memory devices, six bits are used to indicate the column select signal, five bits are used to indicate the column plane, and another bit is used as an enable bit, for a total of twelve bits per redundant address. A fuse may be required for each bit. When the memory device has three storage modes, thirty-six fuses are required to store the address mapping information for all three modes for a defective column select signal.

The inventors have recognized that a memory array may be organized in a manner that causes a change in the address between storage modes to be constant. That is, if one storage mode is considered to be a "default" mode, the addresses in the default mode are shifted by a set amount (e.g., +/−4, +/−8, +/−16) when a different storage mode is selected. The applications cited in the Background section provide non-limiting examples of memory arrays that may be organized in such a manner.

Because the address shift is known, according to other embodiments of the present disclosure, a default address (e.g., an address when in a default storage mode) may be stored in the fuse array, and additional fuses may be provided to indicate an amount the default address should be shifted for other storage modes. The number of fuses required to indicate a storage mode and a shift amount may be less than a number of fuses for the address. Thus, fewer additional fuses may be used. This may reduce the increase in die space compared to the previously described embodiment. In some embodiments, the additional fuses may be four, corresponding to four fuses. Thus, in the example where twelve fuses are used to store an address, rather than using thirty-six fuses to accommodate three storage modes, sixteen fuses may be used.

According to alternative embodiments of the present disclosure, rather than providing additional fuses, logic circuits may be used to implement the shifts to the default address for the different storage modes. Depending on the application, the additional logic circuits may require less die space than the additional fuses.

FIG. 1 is a block diagram of at least a portion of a computing system according to some embodiments of the present disclosure. The computing system 100 includes a memory module 102 and a controller 106 in communication with the memory module 102. In some embodiments, the controller 106 may be included in a processor (not shown) or in communication with the processor. The memory module 102 may include one or more memory devices 104. In the example shown in FIG. 1, there are eight memory devices 104(0-7). However, in other embodiments, there may be more or fewer memory devices (e.g., 2 devices, 4 devices, 16 devices). In some embodiments, additional memory devices 104 may be included to provide for redundancy. In some embodiments, memory module 102 may be a dual in-line memory module (DIMM). In some embodiments, what is shown in FIG. 1 may represent only half of the DIMM (e.g., one of the two channels). In other words, memory module 102 may include sixteen memory devices 104.

The controller 106 may provide commands, addresses, and/or data (e.g., data, metadata, or both) to one or more of the memory devices 104 and receive data from one or more of the memory devices 104. In some embodiments, memory devices 104 may be x4 or x8 memory devices. That is, either four or eight DQ terminals (e.g., pins) may be active. In some embodiments, the memory devices 104 may support both x4 and x8 operation. In some embodiments, whether the memory devices 104 operate in x4 or x8 mode may be based, at least in part, on values stored in mode registers (not shown in FIG. 1) of the memory devices 104. In some embodiments, the memory devices 104 may be x16 memory devices.

In some applications, each of the memory devices 104 may provide eight bits of metadata, for a total of four bytes of data. In some applications, each of the memory devices 104 may provide sixteen bits of metadata, for a total of eight bytes of data. The controller 106 may receive a prefetch from the memory devices 104 that include 128 bits of data and either 8 bits or 16 bits of metadata.

In some embodiments, how much metadata is stored in the memory devices 104 may be based on a value stored in the mode register of the memory device 104. For example, when one value is stored in the mode register, 8 bits of metadata may be stored, when another value is stored in the mode register 16 bits of metadata may be stored, when a further value is stored in the mode register, metadata may not be stored. The varying levels of metadata storage determined by the value in the mode register may be referred to as a storage mode. In some embodiments, the controller 106 may determine the storage mode by providing the value with a mode register write command. In some embodiments, the memory devices 104 may have a "default" storage mode, and the controller 106 may provide the value and the mode register write command when the default storage mode is not desired.

In a first storage mode (e.g., MD16 ON), the physical column planes (e.g., physical planes) of the memory devices 104 associated with data and metadata are accessed by activating column select signals for certain physical column planes. In other storage modes (e.g., MD8 ON, MD OFF), data and metadata are accessed by activating column select signals which may be different than in the first storage mode and/or which may be associated with different physical column planes. This may change the address bits for the column plane and/or column select. For example, in some embodiments, the memory devices 104 may configure the column select signals to be activated in a manner to form a number of virtual column planes (e.g., virtual planes) to access metadata and/or data. In some embodiments, the number of virtual planes may be less than the number of physical planes (e.g., 16 data+2 metadata=18 total physical planes vs. 17 or 16 total virtual planes). In some embodiments, the number of bit lines activated on the virtual planes may be equal to the number of bits lines activated in the physical planes during a memory access operation. By "virtual planes" it is meant that column select signals may be activated or suppressed in a manner that does not correspond to the physical planes of the memory array of the memory device 104. However, from the viewpoint of controller 106, the memory devices 104 may receive and output data and/or metadata as if the virtual planes were physical column planes.

As will be described herein, the memory devices 104 may include redundancy components that accommodate the changing addresses caused by the reconfiguration of the column select signals between the physical and virtual planes. Thus, defective column select signals are remapped to redundant column selects even when the address of the defective column select changes based on the selected storage mode.

In some embodiments, when the controller 106 provides a mode register write command and a value to the memory devices 104 to change the storage mode from the default mode to another storage mode, the mode register write command may trigger a broadcast operation to provide the redundancy information for the new storage mode to the banks. The controller 106 may change the storage mode at any time with the mode register write command, but data stored in the memory arrays of the memory devices 104 may no longer be accessible because the physical to logical addressing mapping of the memory array will have changed. Accordingly, when changing from the default storage mode is desired, the controller 106 may change the storage mode during or shortly after the powerup sequence and/or during or shortly after the initialization sequence.

Figure 2:
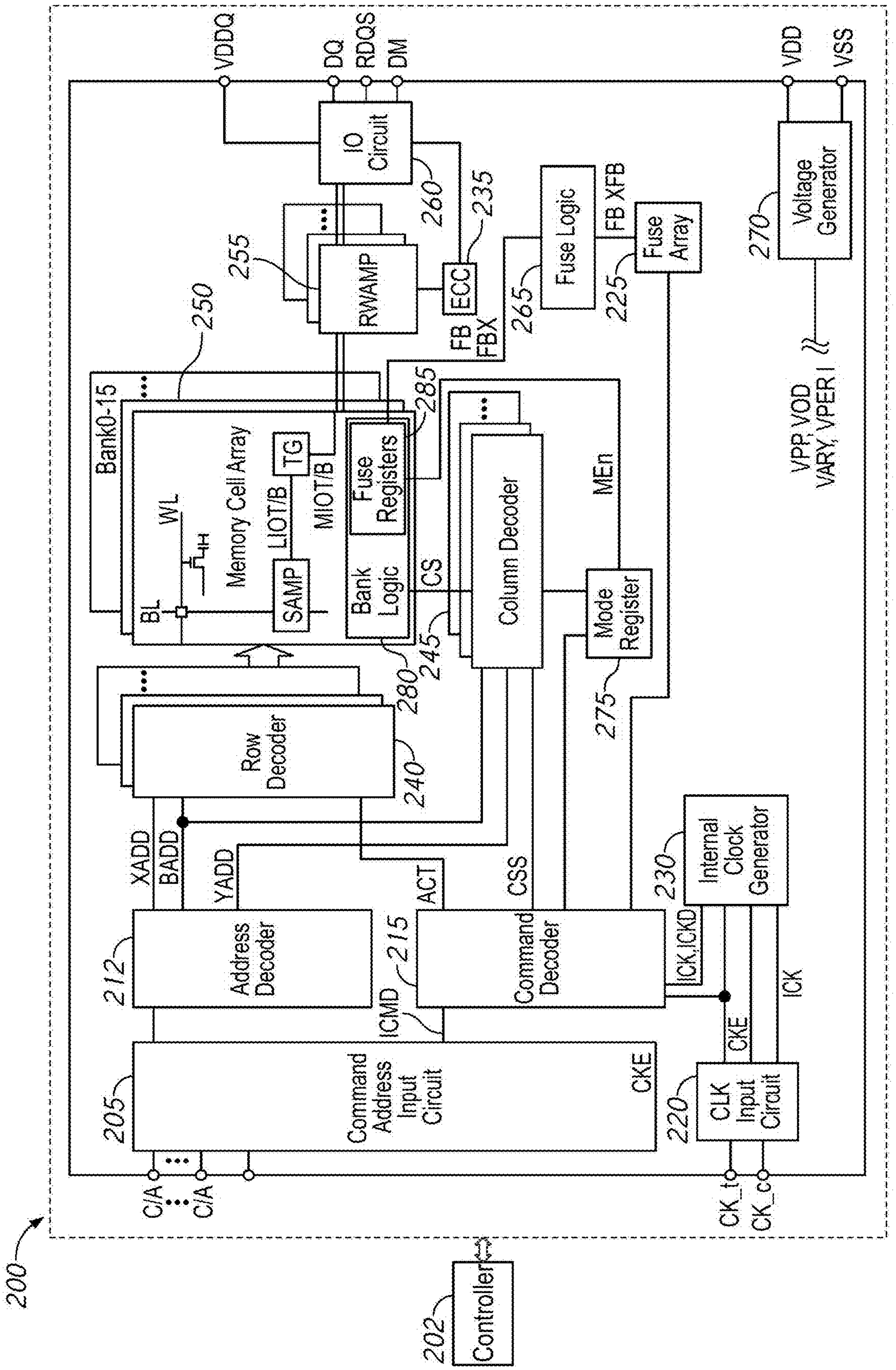
FIG. 2 is a block diagram of a semiconductor device according to some embodiments of the present disclosure.

FIG. 2 is a block diagram of a semiconductor device according to some embodiments of the present disclosure. The apparatus may be a semiconductor device, which may be a memory device 200, and will be referred as such. In some embodiments, the memory device 200 may include, without limitation, a dynamic random access (DRAM) device integrated into a single semiconductor chip. In some examples, the DRAM may be a double data rate (DDR) memory. In some embodiments, one or all of the memory devices 104(0-7) of FIG. 1 may include memory device 200.

The memory device 200 may be included on a die. The die may be mounted on an external substrate, for example, a memory module substrate, a mother board or the like (e.g., package-on-package (PoP)). The memory device 200 may include a memory array 250. The memory array 250 includes a plurality of banks BANK0-15, each bank including a plurality of word lines WL, a plurality of bit lines BL, and a plurality of memory cells MC arranged at intersections of the plurality of word lines WL and the plurality of bit lines BL. Although sixteen banks are shown in FIG. 2, memory array 250 may include any number of banks. The banks may include bank logic circuit 280, which may include various circuit components for operation of the bank. In the embodiment shown, the bank logic circuit 280 includes fuse registers 285. The fuse registers 285 may include latches that store information related to logical addresses remapped to redundant memory lines.

The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches. The TG may be coupled to one or more read/write amplifiers (RWAMP) 255, which may be coupled to an error correction code (ECC) circuit 235. The ECC circuit 235 may be coupled to an IO circuit 260, which may be coupled to one or more external terminals of memory device 200. Read data from the bit line BL is amplified by the sense amplifier SAMP, and transferred to read/write amplifiers 255 over complementary local data lines (LIOT/B), transfer gate (TG), and complementary main data lines (MIOT/B) to the ECC circuit 235. Conversely, write data outputted from the ECC circuit 235 is transferred to the sense amplifier SAMP over the complementary main data lines MIOT/B, the transfer gate TG, and the complementary local data lines LIOT/B, and written in the memory cell MC coupled to the bit line BL.

The memory device 200 includes a fuse array 225, which contains non-volatile storage elements which may store information about addresses in the memory array 250. The fuse array 225 includes non-volatile storage elements, such as fuses or anti-fuses. Each fuse may be in a first state where it is conductive and may be 'blown' to make the fuse insulating instead. Each anti-fuse may be in a first state which is non-conductive, until it is blown to make the anti-fuse conductive instead. Each fuse/anti-fuse may permanently change when it is blown. Each fuse/anti-fuse may be considered to be a bit, which is in one state before it is blown, and permanently in a second state after it's blown. For example, a fuse may represent a logical low before it is blown and a logical high after it is blown, while an anti-fuse may represent a logical high before it is blown and a logical low after it is blown. Discussions of fuses as used herein may generally refer to either fuses or anti-fuses and that embodiments may use fuses, anti-fuses, or a combination thereof in the fuse array 225. In some embodiments, the fuse array 225 may be programmed by the command decoder 215. The command decoder 215 may program the fuse array 225 based on commands and address information provided by an external device. For example, the external device may be the controller 202 in some embodiments. In another example, the external device may be a testing device.

Specific groups of fuses/anti-fuses may be represented by a fuse bus address (FBA), which may specify the physical location of each of the fuses/anti-fuses in the group within the fuse array 225. The group of fuses/anti-fuses associated with a particular FBA may in turn be used to encode an address associated with one or more memory cells of the memory array 250 when the memory device 200 is in a default storage mode. For example, the state of a group of fuses/anti-fuses may represent a memory line address (e.g., either a row address XADD or a column address YADD). According to embodiments of the present disclosure, the fuse array 225 may further include address shift information, which indicates an amount to shift the address based on a selected storage mode. The address and/or shift information in the fuse array 225 may be broadcast out along a fuse bus (FB and xFB) to fuse registers 285.

Each fuse register may be associated with a particular memory line of the memory array 250. In some embodiments, only the redundant memory lines of the memory array 250 (e.g., the rows/columns designated for use in repair operations) may be associated with one of the fuse registers 285. The address and/or shift information stored in a given group of fuses/anti-fuses (e.g., a group specified by an FBA) may be broadcast from the fuse array 225 along the fuse bus and may be latched by a particular fuse register 285. The fuse logic circuit 265 may determine which address broadcast along the fuse bus is latched in which fuse register 285. In this manner, an address stored in the fuse array 225 may be associated with a particular memory line of the memory array 250. When an incoming row/column address XADD or YADD matches the address stored in the fuse register 285, it may then direct access commands to the memory line associated with that fuse register 285.

The fuse registers 285 may each contain a number of fuse latches, each of which stores a bit of the stored memory line address and/or shift information. Since row addresses XADD and column addresses YADD may be different lengths, fuse registers 285 associated with redundant rows may have a different number of fuse latches than fuse registers 285 associated with redundant columns. Each of the fuse registers 285 may be coupled to a fuse match circuit in the bank logic circuit 280, which compares the incoming memory line address as part of an access operation to the address stored in the fuse register 285 to determine if there is a match. If there is a match, the redundant memory line associated with the fuse register 285 may be activated. Some components of the match circuits, as well as other control logic of the fuse registers 285 may be shared between multiple fuse registers 285.

Although the fuse registers 285 are shown in the bank logic circuit 280, in some embodiments, the fuse registers 285 may be located in a peripheral area outside the banks of the array 250 separate from bank logic circuit 280. For example, the fuse registers 285, at least a portion of the match circuits and/or other control logic may be located in the peripheral area, and the fuse registers 285 may provide information to the bank logic circuit 280 of the appropriate bank of the array 250. Furthermore, while the column decoder 245 for each bank is shown separate from the bank logic circuit 280 and fuse registers 285 of each bank, in some embodiments, some of the bank logic circuit 280 components and/or fuse registers 285 may be included in the column decoder 245 or vice vera.

According to embodiments of the present disclosure, bank logic circuit 280 and/or circuits associated with the fuse registers 285 may include address shifting circuitry (e.g., address shifter circuit). When the memory device 200 is not in the default storage mode, the address shifting circuitry may shift the default address provided from the fuse array 225 by an amount indicated by the shift information to map logical and physical address for the selected storage mode. In some embodiments, the address shifting circuitry may be enabled by a signal, such as one provided by mode register 275 (MEn). For example, MEn signal from the mode register 275 may disable the address shifting circuitry when the memory device 200 is in a default storage mode and enable the address shifting circuitry when the memory device 200 is in a non-default storage mode. The MEn signal provided by the mode register 275 may indicate which storage mode the memory device 200 is using.

In alternative embodiments, the fuse array 225 may not store address shift information, and additional logic circuits (not shown in FIG. 2) may be enabled (e.g., by mode register 275) to shift the addresses stored in the fuse registers 285 when the memory device 200 is not in the default storage mode.

The memory device 200 may employ a plurality of external terminals that include command and address terminals coupled to a command/address (C/A) bus to receive command and address signals, clock terminals to receive clock signals CK_t and CK_c, data terminals DQ, RDQS, and power supply terminals VDD, VSS, VDDQ, and VSSQ.

The C/A terminals may be supplied with an address and a bank address signal from outside, for example, from a controller 202. The address signal and the bank address signal supplied to the address terminals are transferred, via a command/address input circuit 205, to an address decoder 212. The address decoder 212 receives the address signals and supplies a decoded row address signal XADD to the row decoder 240, and a decoded column address signal YADD to the column decoder 245. The address decoder 212 also receives the bank address signal BADD and supplies the bank address signal to the row decoder 240 and the column decoder 245.

The C/A terminals may further be supplied with command signals from, for example, a controller 202. In some embodiments, controller 202 may be implemented or included in controller 106. The command signals may be provided as internal command signals ICMD to a command decoder 215 via the command/address input circuit 205. The command decoder 215 includes circuits to decode the internal command signals ICMD to generate various internal signals and commands for performing operations, for example, a row activation signal (ACT) to select a word line. Another example may be providing internal signals to enable circuits for performing operations, such as control signals to enable signal input buffers that receive clock signals.

Each bank BANK0-15 may be organized into multiple physical column planes (CP). Each column plane may be associated with multiple column selects (e.g., CS0-63, CS0-59, CS0-55). Depending on a storage mode, some column planes may store data while one or more column planes store metadata, or all of the column planes may store data. For example, in a first mode, two column planes may store metadata and the remaining planes store data. In a second mode, one column plane stores metadata and the remaining planes store data. In a third mode, all of the column planes store data. A separate plane may store ECC data in some embodiments. In some embodiments, the column planes may include additional column selects (redundant column selects) for repairing defective column selects in the corresponding planes. In some embodiments, each bank may include an additional GCR plane with redundant column selects available to repair defective column selects in any of the column planes of the bank. In some embodiments, the GCR may have fewer column selects than other column planes (e.g., 8, 16, 32). The redundant column selects may be activated based at least in part, on the information stored in the fuse registers 285.

The C/A terminals may receive an access command which is a read command. When a read command is received, and a bank address, a row address and a column address are timely supplied with the read command, a codeword including read data, metadata, and read ECC data (e.g., parity bits) is read from memory cells in the memory array 250 corresponding to the row address and column address. The read command is received by the command decoder 215, which provides internal commands so that read data from the memory array 250 is provided to the ECC circuit 235. The ECC circuit 235 may use the parity bits in the codeword to determine if the codeword includes any errors, and if any errors are detected, may correct them to generate a corrected codeword (e.g., by changing a state of the identified bit(s) which are in error). The corrected codeword (without the parity bits) is output from the data terminals DQ via the input/output circuit 260.

The C/A terminals may receive an access command which is a write command. When the write command is received, and a bank address, a row address, and a column address are timely supplied as part of the write operation, and write data is supplied through the DQ terminals to the ECC circuit 235. The write data (which may include write data and metadata) supplied to the data terminals DQ is written to a memory cells in the memory array 250 corresponding to the row address and column address. The write command is received by the command decoder 215, which provides internal commands so that the write data is received by data receivers in the input/output circuit 260. The write data is supplied via the input/output circuit 260 to the ECC circuit 235. The ECC circuit 235 may generate ECC data (e.g., a number of parity bits) based on the write data, and the write data and the parity bits may be provided as a codeword to the memory array 250 to be written into the memory cells MC.

The ECC circuit 235 may be used to ensure the fidelity of the data read from a particular group of memory cells to the data written to that group of memory cells. The memory device 200 may include a number of different ECC circuits 235, each of which is responsible for a different portion of the memory cells MC of the memory array 250. For example, there may be one or more ECC circuits 235 for each bank of the memory array 250. Typically, each bank BANK0-15 includes a column plane for the storage of ECC data (e.g., parity bits) and additional column planes for the storage of data (e.g., sixteen column planes). In these applications, the ECC circuit 235 generates eight bits of ECC data (e.g., 8 bits of ECC data) for each prefetch of 128 bits. This may allow for the ECC circuit 235 to provide single bit error correction.

The command decoder 215 may access mode register 275 that is programmed with information for setting various modes and features of operation for the memory device 200. For example, the mode register 275 may provide parameters that allow the memory device 200 to operate at different frequencies, provide different burst lengths, allow banks BANK0-15 to be organized into different groups, operate in x4, x8, or x16 mode, and/or other different operating conditions. In some embodiments, mode register 275 may include multiple registers.

The information in the mode register 275 may be programmed by providing the memory device 200 a mode register write command, which causes the memory device 200 to perform a mode register write operation. In some embodiments, data to be written to the mode register 275 is provided via the C/A terminals and/or the DQ terminals. The command decoder 215 accesses the mode register 275, and based on the programmed information along with the internal command signals provides the internal signals to control the circuits of the memory device 200 accordingly. Information programmed in the mode register 275 may be externally provided by the memory device 200 using a mode register read command, which causes the memory device 200 to access the mode register 275 and provide the programmed information (e.g., to the memory controller 202). In some embodiments, the information may be provided via the C/A terminals and/or the DQ terminals.

The mode register 275 may be programmed with a value that determines a storage mode. The storage mode may determine an amount of metadata stored in the memory device 200. When one value is stored in the register, no metadata may be stored (e.g., an operating mode where metadata is disabled). When another value is stored in the register, an amount of metadata may be stored, and when a further value is stored in the register, a different amount of metadata may be stored (e.g., operating modes where metadata is enabled). For example, the memory device 200 may have a mode where 16 bits of metadata are stored per prefetch (MD16 ON), a mode where 8 bits of metadata are stored per prefetch (MD8 ON), and a mode where no metadata is stored (MD OFF). Based on the value, the mode register 275 may provide signals to various components of the memory device 200 to cause the memory device 200 to operate in the selected storage mode. For example, the logical-to-physical address mapping, activation or suppression of column selects, and the like may be based, at least in part, on signals provided by the mode register 275. In some embodiments, one of the storage modes may be the default storage mode, and the remaining storage modes may be non-default storage modes. Which mode is selected as the default mode may be arbitrary or may be based on the organization of the array 250 and/or logic-to-physical address mapping scheme utilized by the memory device 200.

According to embodiments of the present disclosure, the mode register 275 may selectively enable circuitry for shifting addresses stored in the fuse array 225 to remap logical addresses to redundant column selects based on a non-default storage mode.

In some embodiments, writing a value to the mode register 275 that changes the storage mode (e.g., from the default storage mode to a non-default storage mode) may initiate a broadcast operation. The signal triggering the broadcast operation may be provided to the fuse array 225, fuse logic circuit 265, fuse registers 285, and/or other components of the memory device 200.

Turning to the explanation of the external terminals included in the memory device 200, the clock terminals and data clock terminals are supplied with external clock signals and complementary external clock signals. The external clock signals CK_t, CK_c may be supplied to a clock input circuit 220. When enabled, input buffers included in the clock input circuit 220 pass the external clock signals. For example, an input buffer passes the CK_t and CK_c signals when enabled by a CKE signal from the command decoder 215. The clock input circuit 220 may use the external clock signals passed by the enabled input buffers to generate internal clock signal ICK. The internal clock signal ICK are supplied to internal clock circuit 230 for providing one or more clock signals to the various components of memory device 200.

The internal clock circuits 230 includes circuits that provide various phase and frequency controlled internal clock signals based on the received internal clock signals. For example, the internal clock circuits 230 may include a clock path (not shown in FIG. 2) that receives the ICK clock signal and provides internal clock signals ICK and ICKD to the command decoder 215. Optionally, the input/output circuit 260 may include clock circuits and driver circuits for generating and providing the RDQS signal to a controller.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and like based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks. However, different potentials and/or uses of the potentials may be used in other examples.

The power supply terminal is also supplied with power supply potential VDDQ. The power supply potentials VDDQ is supplied to the input/output circuit 260. In some embodiments, VDDQ may be provided together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

Figure 3:
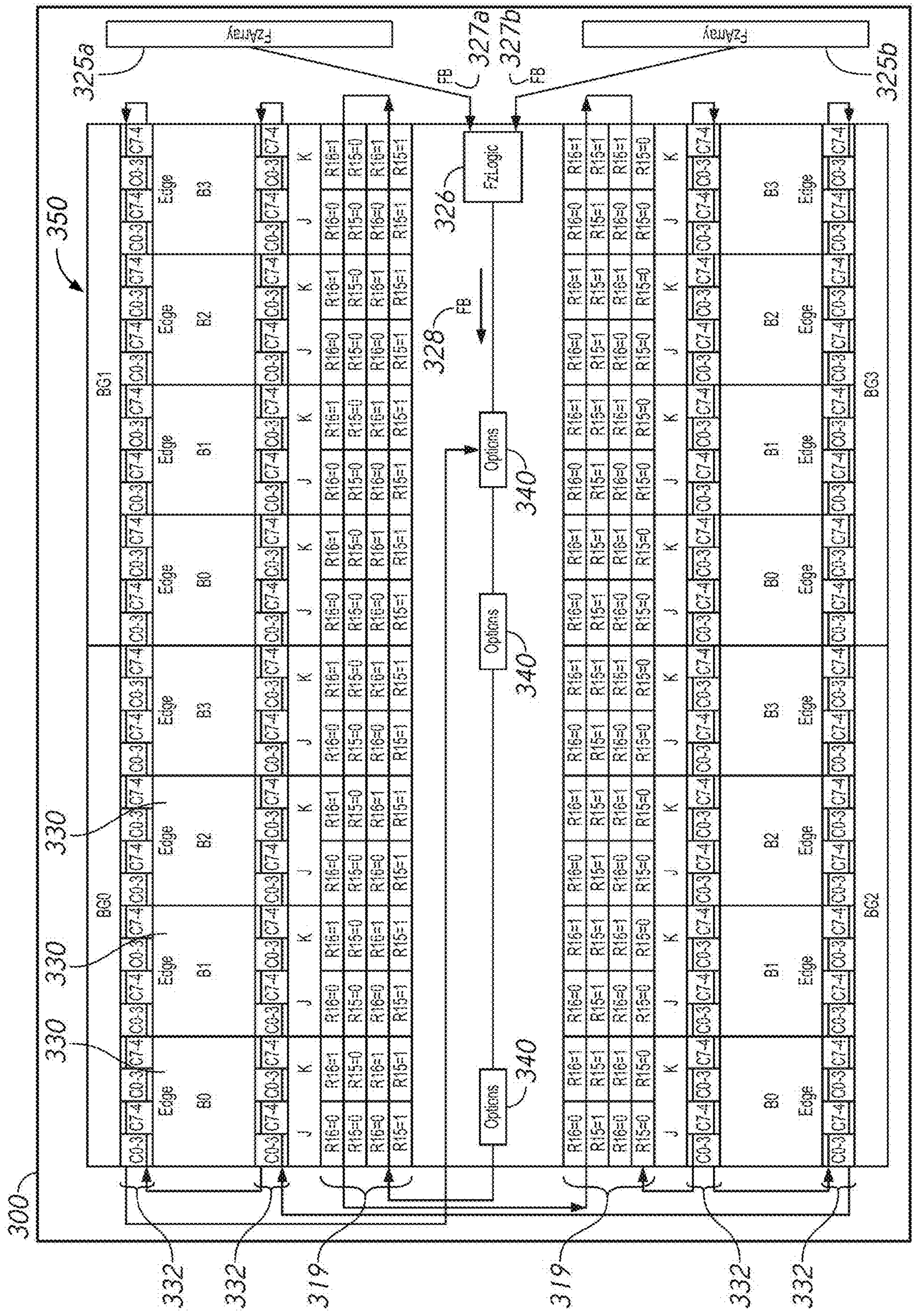
FIG. 3 is a block diagram representing at least a portion of a memory device according to some embodiments of the present disclosure.

FIG. 3 is a block diagram representing at least a portion of a memory device according to some embodiments of the present disclosure. FIG. 3 shows the transmission path of a fuse bus 328 from a pair of fuse arrays 325*a* and 325*b* through the memory device 300 to memory array 350. In some embodiments, memory device 300 may be included in memory device 200 of FIG. 2 and/or memory devices 104 in FIG. 1. In some embodiments, fuse arrays 325*a* and 325*b* may be included in fuse array 225. In some embodiments, the memory array 350 may be an implementation of the memory array 250. In the example shown in FIG. 3, memory array 350 includes 16 banks 330 that are organized into four bank groups (BG0-BG3) of four banks 330 each. Each of the banks 330 is associated with a set of fuse registers such as row registers 319 and column registers 332. The row registers 319 and/or column registers 332 may be included in fuse registers 285 in FIG. 2 in some embodiments.

Addresses may be broadcast out along a fuse bus 328 from the fuse array 325*a-b*. In the particular example of FIG. 3, there may be a pair of fuse arrays 325*a* and 325*b*. Each of the fuse arrays 325*a*, 325*b* may store a number of addresses, encoded in the conductive state of fuses and/or anti-fuses, which may be streamed out along the fuse bus 328 to the fuse registers such as the row registers 319 and column registers 332.

In some embodiments, the fuse array 325*a* may include anti-fuses, and may be a non-inverting fuse array (since the default value of the anti-fuses is a low logical level) and the fuse array 325*b* may include fuses and be an inverting fuse array. It may be necessary to 'invert' an address (e.g., swap low logical levels for high logical levels and vice versa) before providing an address based on the inverting fuse array 325*b*. It should be understood that other methods of organizing addresses in the fuse array(s) may be used in other embodiments. For example, a single fuse array may be used with only fuses, only anti-fuses, or a mix thereof.

During a broadcast operation (e.g., during memory device initialization or responsive to changing from the default storage mode), the fuse arrays 325*a-b* may broadcast the row addresses and the column addresses stored in the fuse arrays 325*a-b* along the fuse bus 328. In the particular example of FIG. 3, during the broadcast operation the fuse logic circuit 326 may receive a portion of the addresses along fuse bus portion 327*a* from the fuse array 325*a*, and a portion of the addresses along fuse bus portion 327*b* from the fuse array 325*b*. The fuse logic circuit 326 may combine the addresses onto the fuse bus 328 by alternating whether the addresses from the first fuse bus portion 327*a* or the second fuse bus portion 327*b* are provided along the fuse bus 328. For clarity, the addresses provided along the fuse bus portion 327*a* may be referred to as 'even' addresses and the addresses provided along the fuse bus portion 327*b* may be referred to as 'odd' addresses. It should be understood that even and odd addresses refer to the fuse array 325*a-b* the address is stored in, and that both fuse bus portions 327*a-b* may include addresses with numerical values which are both even and odd. Other organizations of addresses in the fuse array 325*a-b* may be used in other embodiments.

The fuse logic circuit 326 may provide information along the fuse bus 328. The fuse logic circuit 326 may alternate between providing the even addresses from fuse bus portion 327*a* and the odd addresses from fuse bus portion 327*b* along the fuse bus 328. The fuse logic circuit 326 may also perform one or more operations based on the information of the fuse bus. For example, during a repair operation, the fuse logic circuit 326 may provide a select signal (e.g., such as a write signal) which indicates which fuse register a given address along the fuse bus 328 is latched in.

Optionally, the fuse logic circuit 326 may provide the information to the fuse bus 328, which may pass the information through one or more options circuits 340. The options circuits 340 may include various settings of the memory which may interact with the addresses along the fuse bus 328. For example, the options circuits 340 may include fuse settings, such as the test mode and power supply fuses. Information stored in the fuse arrays 325*a-b* may be latched and/or read by the options circuits 340, which may then determine one or more properties of the memory based on the options data provided along the fuse bus 328.

After passing through the options circuits 340 the fuse bus 328 may pass through the row registers 319 for all of the memory banks 330 and through the column registers 332 for all of the memory banks 330. As well as providing information (including address information) along the fuse bus 328, the fuse logic circuit 326 may also provide one or more select signals along the fuse bus 328. The select signals may be associated with a particular packet of information along the fuse bus and may determine which circuit along the fuse bus 328 the particular packet of information is associated with. For example, if a row latch select signal is in an active state, it may indicate that the packet of information is to be stored in a column register 332. In some embodiments, this may overwrite an address already stored in the column register 332 with the address from the fuse bus 328. Further select signals may be used to specify a particular location of the specific column register 332 which is intended to store the packet of information (e.g., a bank group select signal, a bank select signal, etc.).

Figure 4:
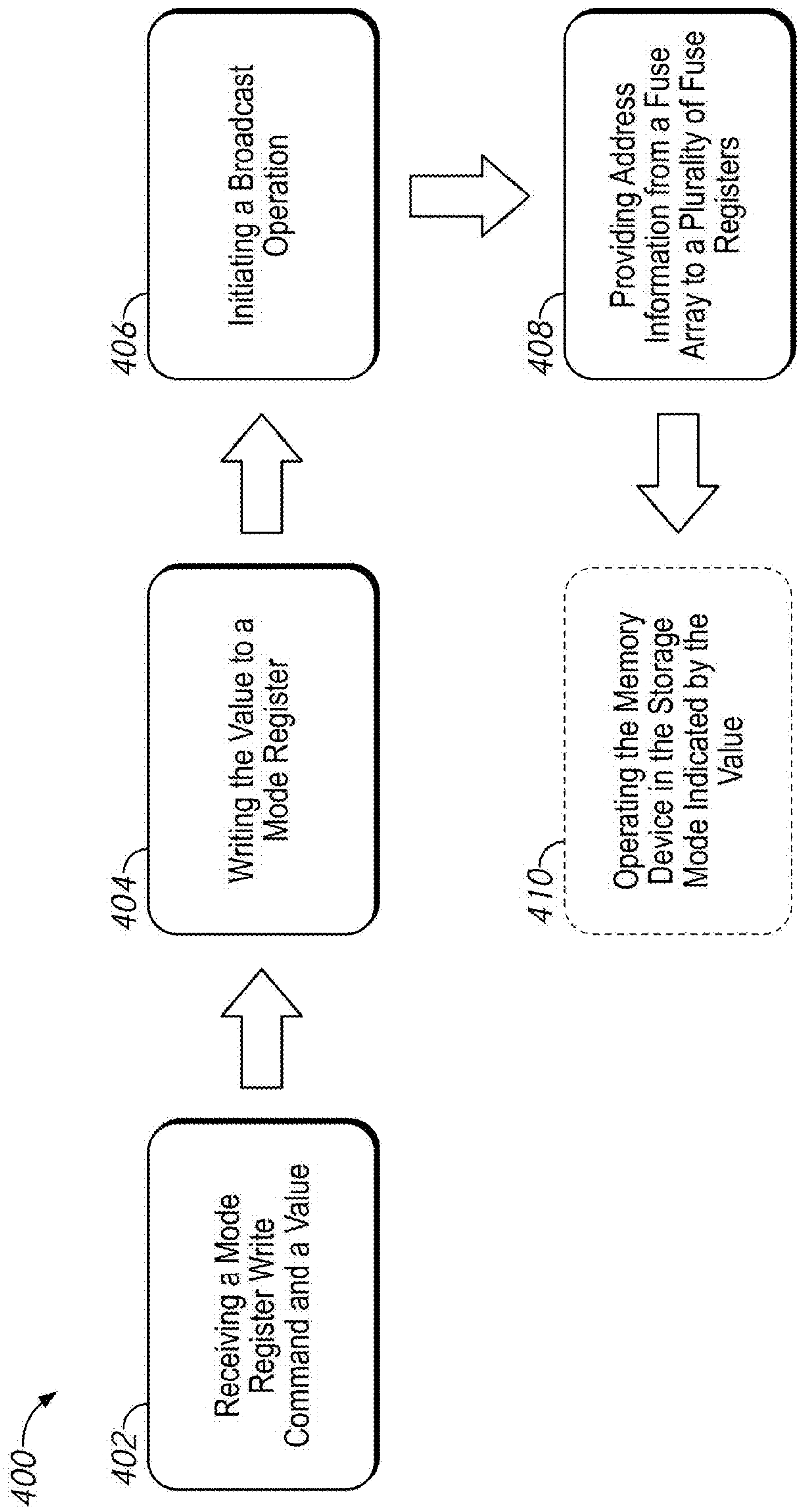
FIG. 4 a flow chart of a method according to some embodiments of the present disclosure.

FIG. 4 is a flow chart of a method according to some embodiments of the present disclosure. In some embodiments, the method in flowchart 400 may be performed in whole or in part by memory devices 104, memory device 200, and/or memory device 300.

At block 402, "receiving a mode register write command and a value" may be performed.

At block 404, responsive to the mode register write command, "writing the value to a mode register" may be performed. The value indicates a storage mode of a plurality of storage modes, and writing the value changes the storage mode of the memory device in some embodiments. In some embodiments, the mode register may be mode register 275.

At block 406, responsive to writing the value to the mode register "initiating a broadcast operation" may be performed.

At block 408, responsive to initiating the broadcast operation, "providing address information from a fuse array to a plurality of fuse registers" may be performed. For example, the fuse array may be fuse array 225 and/or fuse array 325*a-b*. The fuse registers may be fuse registers 285 and/or column registers 332. In some embodiments, wherein the address information comprises address information for a portion of a plurality of column selects remapped to a plurality of redundant column selects for the storage mode of the plurality of storage modes. In some embodiments, providing address information from the fuse array to the plurality of fuse registers comprises providing the address information from the fuse array to fuse logic and providing the address information from the fuse logic to the plurality of fuse registers.

Optionally, after block 408, "operating the memory device in the storage mode indicated by the value" may be performed as indicated by block 410. For example, the memory array may be arranged to store an amount of metadata indicated by the storage mode, and the memory device may provide and store said amount of metadata.

In some embodiments, one of the plurality of storage modes is a default storage mode. Optionally, the method shown in FIG. 4 may further include powering up the memory device, initiating a first broadcast operation, and providing the address information for the default storage mode from the fuse array to the plurality of fuse registers. These steps may occur before the steps shown in flowchart 400.

Figure 5:
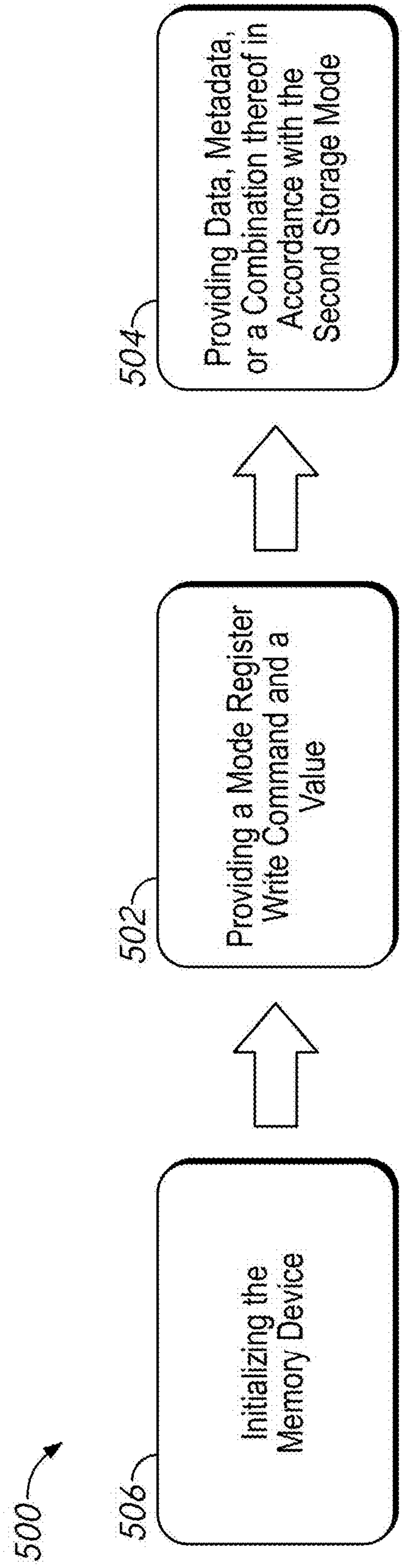
FIG. 5 a flow chart of a method according to some embodiments of the present disclosure.

FIG. 5 is a flow chart of a method according to embodiments of the present disclosure. In some embodiments, the method in flowchart 500 may be performed in whole or in part by controller 106 and/or controller 202.

At block 502, "providing a mode register write command and a value" may be performed. Providing the mode register write command and value may cause the memory device to change from a first storage mode to a second storage mode of a plurality of storage modes of the memory device. The memory device may include memory devices 104, memory device 200, and/or memory device 300. In some embodiments, changing from the first storage mode to the second storage mode causes the memory device to initiate a broadcast operation. In some embodiments, the first storage mode is a default storage mode of the plurality of storage modes, and the second storage mode is a non-default storage mode.

Optionally, at block 504, "providing data, metadata, or a combination thereof in accordance with the second storage mode" may be performed. In some embodiments, the controller may wait a period of time between providing the mode register write command and providing the data, the metadata, or the combination thereof. This may allow adequate time for the broadcast operation to complete. The period of time may be defined in a specification of the memory, a standard (e.g., JEDEC, IEEE), or both. Optionally, the method in flowchart 500 may further include "initializing the memory device," as indicated by block 506.

Returning to FIG. 3, according to some embodiments of the present disclosure, the fuse bus 328 may pass addresses based on a setting in a mode register. For example, when all addresses for all storage modes are stored in fuse array 325*a-b*, the addresses associated with the storage mode indicated by the mode register may be broadcast.

According to some embodiments of the present disclosure, address information associated with a default storage mode and address shift information may be passed by the fuse bus 328 from the fuse array 325*a-b*. The address shift information may be used to shift the address provided from the fuse array 325*a-b* when the memory device 300 is not in a default storage mode. In some embodiments, column address shift information may be stored in the column registers 332. The column registers 332 may provide the column address to the bank logic circuit, such as bank logic circuit 280 in FIG. 2. The column address provided to the bank logic circuit may be shifted from the column address stored in the column registers 332 based, at least in part, on the shift information. In other embodiments, address may be shifted at the fuse logic 326 prior to being broadcast to the banks.

The shift information may include a number of bits (e.g., 4, 8). The bits may be organized into a number of subsets. The number of subsets may be equal to a number of storage modes in addition to a default storage mode. The values of the bits in each subset may indicate the shift in the column address to be performed for that storage mode. For example, a memory device with three storage modes has one default storage mode and two non-default storage modes. The shift information may be divided into two subsets of bits. One subset stores information for shifting the column address for one of the non-default storage modes and the other subset stores information for shifting the column address for the other non-default storage mode.

FIG. 6 illustrates tables for encoding an address shift in fuses in accordance with some embodiments of the present disclosure. The encoding scheme shown in table 600 and table 602 may be used for programming fuses in a fuse array such as fuse array 225 and/or fuse arrays 325*a-b*. The information may be provided to fuse registers such as fuse registers 285 and/or column registers 332 along with the column address in some embodiments.

Table 600 illustrates examples of values programmed into four fuses (e.g., four bits) to provide the address shift information. The top column of the first four rows indicates the fuse bits Bit<3:0> and the last column indicates an amount an address must be shifted. In some embodiments, Bit<1:0> store the address shift information for a first non-default storage mode and Bit<3:2> store the address shift information for a second non-default storage mode. In some embodiments, the first non-default mode may be MD16 ON, the second non-default mode may be MD8 ON, and the default storage mode may be MD OFF. However, in other embodiments, MD16 ON or MD8 ON may be the default storage mode. The two bottom rows are examples of shift information stored in the fuses. Each row may be associated with different column addresses of a memory array in some embodiments.

Table 602 illustrates an example of encoding the shift information in two bits. For example, the second row shows no shift encoded as '00' and the third row shows a shift of X bits encoded as '01.' Turning back to table 600, in the second row, no address shift is required for the first non-default mode as indicated by Bit<1:0>=00. A shift of X bits to the address is required for the second non-default mode for the column address as indicated Bit<3:2>=01. In the third row, a shift of Z bits to the address is required for the first non-default mode as indicated by Bit<1:0>=11, and a shift of Y bits is required for the second non-default mode as indicated by Bit<3:2>=10.

X, Y, and Z may be any positive or negative integer. The values will be based on the organization of the memory array and the storage modes. For example, X may equal −4, Y may equal −8, and Z may equal 4. In another example, X may equal 4, Y may equal 8, and Z may equal 4. The encoding shown in table 602 is merely an example, and any suitable encoding may be used. For example, no shift may be assigned to '11' rather than '00.'

In the example shown, there are two non-default storage modes, and four possible address shifts (none, X, Y, and Z). As shown, two bits are used to store the shift information for each storage mode for a total of four bits. Thus, for three storage modes, four additional fuses may be included in the fuse array along with the fuses storing the column address. When the column address is 12 bits, this is a total of 16 bits. This is less than the 36 bits required to store the column address for each storage mode.

Table 600 and 602 are provided merely as examples, and the encoding scheme for address shifts are not limited to what is illustrated in FIG. 6. For example, additional bits in each subset may be used if there are more possible shifts (e.g., none, W, X, Y, and Z). In another example, there may be additional subsets if the memory device supports more than two non-default storage modes (e.g., MD4 ON, MD8 ON, MD16 ON, and MD OFF). In some of these examples, there may be more than four bits to store shift information. In other examples, there may be fewer bits in each subset if there are fewer possible shifts and/or fewer subsets if the memory device supports only one non-default storage mode. In some of these examples, there may be fewer than four bits of shift information.

Figure 7:
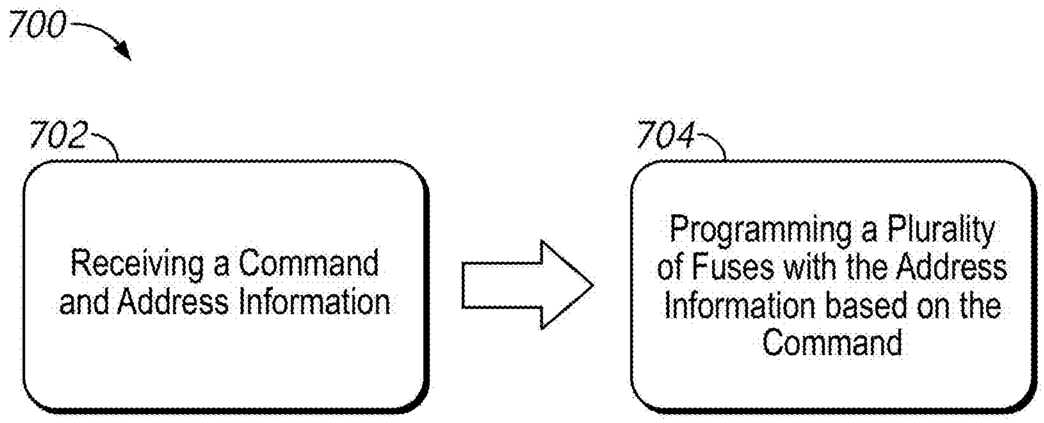
FIG. 7 a flow chart of a method according to some embodiments of the present disclosure.

FIG. 7 is a flow chart of a method according to some embodiments of the present disclosure. In some embodiments, the method in flowchart 700 may be performed in whole or in part by memory devices 104, memory device 200, and/or memory device 300.

At block 702, "receiving a command and address information" may be performed. The information may be received at a memory device from an external device. For example, a controller, such as controller 106 and/or controller 202. The external device may be a testing device in some embodiments.

At block 704, "programming a plurality of fuses with the address information based on the command." The address information indicates a plurality of column selects remapped to a plurality of redundant column selects for a plurality of storage modes of the memory device. In some embodiments, the address information comprises an address and an amount to shift the address when the memory device is in a non-default storage mode of the plurality of storage modes.

In some embodiments, programming comprises programming twelve fuses of the plurality of fuses to store an address and programming four fuses with an amount to shift the address. For example, using the encoding scheme described in FIG. 6. However, the programming may include programming an address for each of the plurality of storage modes (e.g., "brute force method"). Although, this embodiment may require additional fuses.

Optionally, the method shown in flowchart 700 may further include receiving a mode register write command and a value indicating a storage mode of the plurality of storage modes and writing the value to the mode register.

Figure 8:
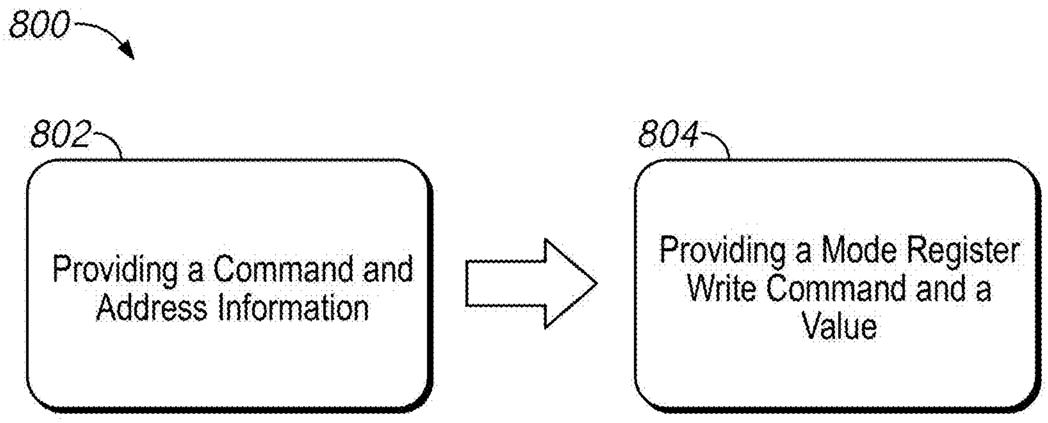
FIG. 8 a flow chart of a method according to some embodiments of the present disclosure.

FIG. 8 is a flow chart of a method according to embodiments of the present disclosure. In some embodiments, the method in flowchart 800 may be performed in whole or in part by controller 106 and/or controller 202.

At block 802, "providing a command and address information" may be performed. This may cause a memory device to program a plurality of fuses with the address information. The address information indicates a plurality of column selects remapped to a plurality of redundant column selects for a plurality of storage modes of the memory device. The command may be provided by an external device such as a controller or testing device. The address information comprises an address and an amount to shift the address when the memory device is in a non-default storage mode of the plurality of storage modes in some embodiments. In other embodiments, the address information comprises a plurality of addresses, wherein the plurality of addresses comprises at least one address for each of the plurality of storage modes.

At block 804, "providing a mode register write command and a value" may be performed. The value may be written to a mode register of the memory device. This may cause the memory device to operate in a storage mode of a plurality of storage modes.

Figure 9:
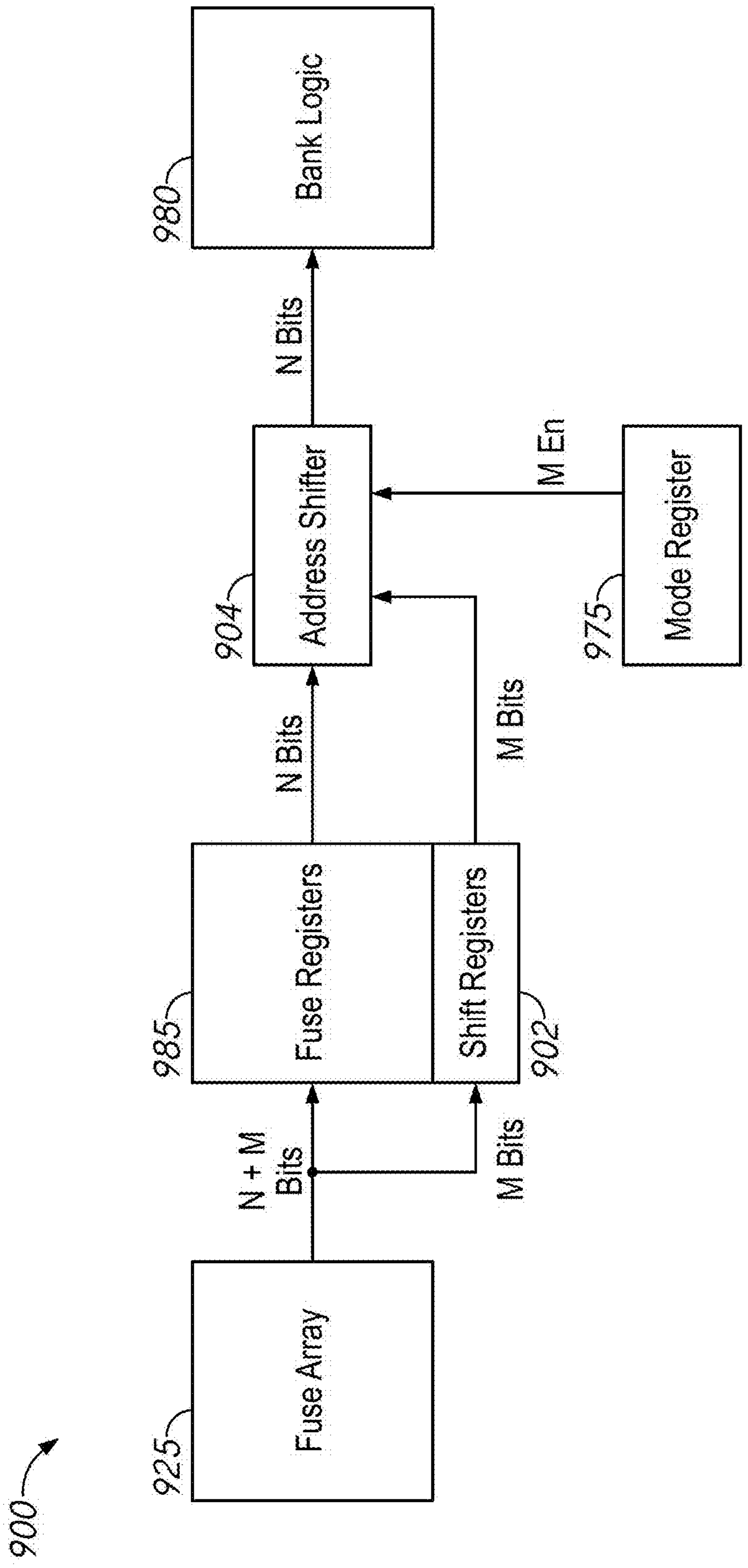
FIG. 9 is a block diagram representing at least a portion of a memory device according to some embodiments of the present disclosure.

FIG. 9 is a block diagram representing at least a portion of a memory device according to some embodiments of the present disclosure. The memory device 900 may be included in memory device 300, memory device 200, and/or memory devices 104 in some embodiments. The memory device 900 may include a fuse array 925, fuse registers 985, address shifter circuit 904, bank logic circuit 980, and mode register 975. The fuse array 925 may be included in fuse array 325*a-b* and/or fuse array 225 in some embodiments. In some embodiments, the fuse registers 985 may be included in column registers 332, and/or fuse registers 285. Bank logic circuit 980 may be included in bank logic circuit 280 in some embodiments. Mode register 975 may be included in mode register 275 in some embodiments.

The fuse registers 985 may include latches, flip-flops, and/or other components for storing information received from the fuse array 925, such as column addresses for remapping logical addresses to redundant column selects when the "original" column selects are defective. The column addresses provided by the fuse array 925 may be for a default storage mode of the memory device 900 (e.g., default column address). The fuse registers 985 may include shift registers 902 that store address shift information. The address shift information may indicate how to shift the default column address to another address corresponding to a non-default storage mode. The address shift information stored in the shift registers 902 may use an encoding scheme, such as the encoding scheme described with reference to FIG. 6, in some embodiments. During a broadcast operation, the fuse array 925 may provide N bits corresponding to a column address and M bits corresponding to the shift information. In some embodiments, N may equal 12 bits and M may equal 4 bits. Although not shown in FIG. 9, in some embodiments, the bits may be provided via fuse logic circuits, such as fuse logic circuit 326 and/or fuse logic circuit 265.

The fuse registers 985 may provide column address information to the bank logic circuit 980 (e.g., fuse match circuits or other components) via the address shifter circuit 904. The address shifter circuit 904 may receive the default column address and the shift information from the fuse registers 985. The address shifter circuit 904 may further receive an enable signal MEn from the mode register 975. The MEn signal may disable the address shifter circuit 904 when the memory device 900 is in a default storage mode. When the address shifter circuit 904 is disabled, the N bits of the column address are passed to the bank logic circuit 980 without modification. When the memory device 900 is in a non-default storage mode, the MEn signal may enable the address shifter circuit 904 and may further indicate which non-default storage mode has been selected.

When enabled by MEn, the address shifter circuit 904 may shift the column address provided by the fuse registers 985 based on the M bits provided by the shift registers 902. The indication of the selected non-default storage mode by the MEn signal may determine which of multiple shifts is performed by the address shifter circuit 904. For example, when the encoding scheme described with reference to FIG. 6 is used, the address shifter circuit 904 may shift the column address by an amount indicated by Bits<1:0> of the M bits when a first non-default storage mode is indicated by MEn and may shift the column address by an amount indicated by Bits<3:2> of the M bits when a second non-default storage mode is indicated by MEn. The shifted column address is provided from the address shifter circuit 904 to the bank logic circuit 980.

While the embodiments using encoding of address shift information, for example as described with reference to FIGS. 6 and 9 (among others), use less additional fuses than "brute forcing" embodiments (where every column address is stored for every storage mode), in some applications, additional logic circuits may utilize less layout area than additional fuses. Furthermore, because shift information does not need to be transmitted from the fuse array to the fuse registers, in some embodiments where shift logic circuits are utilized instead of fuses, additional broadcast operations may not be needed when the storage mode of the memory device is changed from the default storage mode. This may reduce initialization and/or powerup time of the memory device in some cases.

Figure 10:
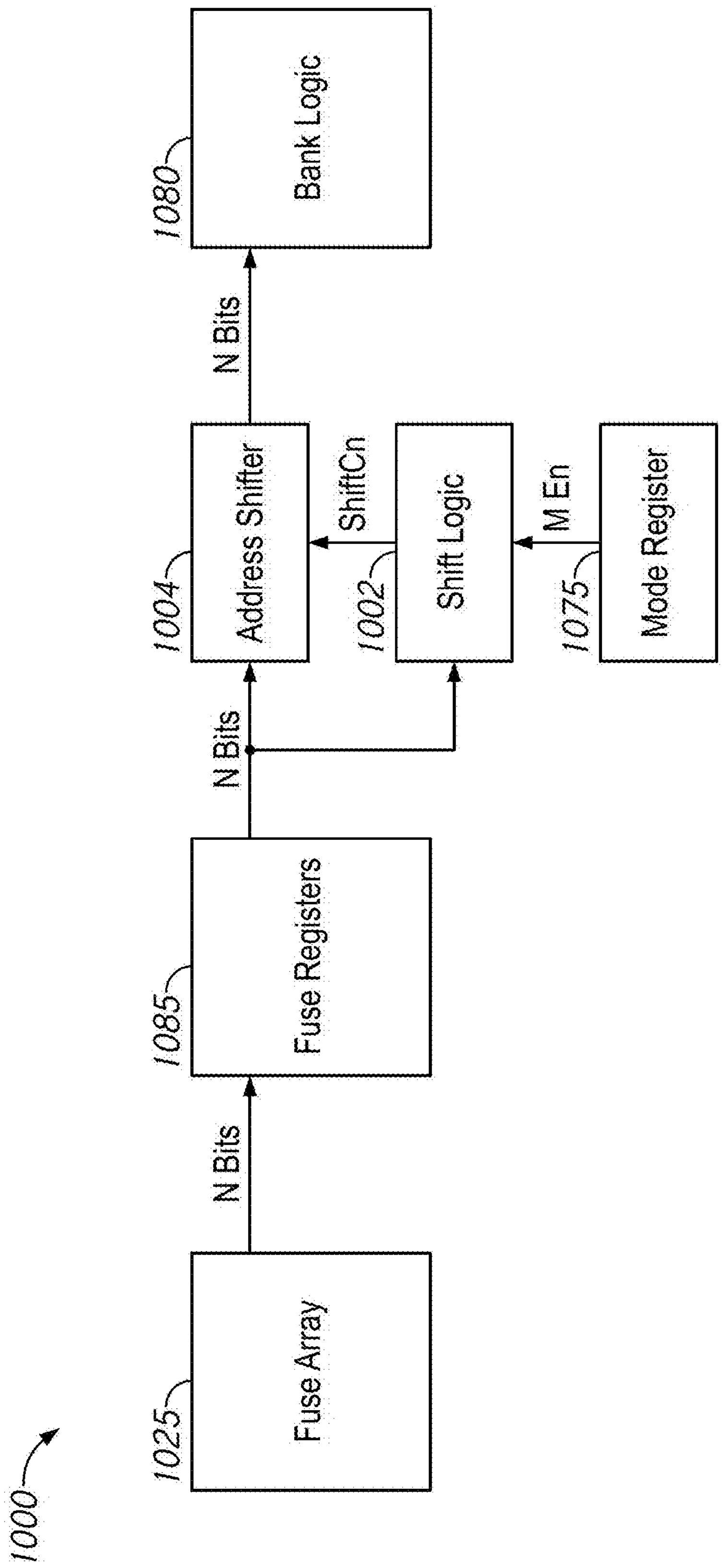
FIG. 10 is a block diagram representing at least a portion of a memory device according to some embodiments of the present disclosure.

FIG. 10 is a block diagram representing at least a portion of a memory device according to some embodiments of the present disclosure. The memory device 1000 may be included in memory device 300, memory device 200, and/or memory devices 104 in some embodiments. The memory device 1000 may include a fuse array 1025, fuse registers 1085, shift logic circuit 1002, address shifter circuit 1004, bank logic circuit 1080, and mode register 1075. The fuse array 1025 may be included in fuse array 325*a-b* and/or fuse array 225 in some embodiments. In some embodiments, the fuse registers 1085 may be included in column registers 332, and/or fuse registers 285. Bank logic circuit 1080 may be included in bank logic circuit 280 in some embodiments. Mode register 1075 may be included in mode register 275 in some embodiments.

The fuse registers 1085 may include latches, flip-flops, and/or other components for storing information received from the fuse array 1025, such as column addresses for remapping logical addresses to redundant column selects when the "original" column selects are defective. The column addresses provided by the fuse array 1025 may be for a default storage mode of the memory device 1000 (e.g., default column address). Unlike the embodiment shown in FIG. 9, the fuse registers 1085 may not include registers that store address shift information. During a broadcast operation, the fuse array 1025 may provide N bits corresponding to a column address. Although not shown in FIG. 10, in some embodiments, the bits may be provided via fuse logic circuits, such as fuse logic circuit 326 and/or fuse logic circuits 265.

The fuse registers 1085 may provide column address information to shift logic circuits 1002 and address shifter circuit 1004. The shift logic circuits 1002 may further receive an enable signal MEn from mode register 1075. The MEn signal may indicate a storage mode has been selected. The shift logic circuit 1002 may disable the address shifter circuit 1004 by shift control signal ShiftCn when the MEn signal indicates the memory device 1000 is in a default storage mode. When disabled, the column address may be provided from the address shifter circuit 1004 to the bank logic circuit 1080 without modification (e.g., the same column address as was stored in the fuse array 1025 and fuse registers 1085). When the MEn signal indicates a non-default storage mode, the shift logic circuit 1002 may use the MEn signal and the N bits of the column address to determine an amount the column address should be shifted for the selected non-default storage mode. The shift amount (e.g., shift information) may be provided by the ShiftCn signal to the address shifter circuit 1004. The address shifter circuit 1004 may shift the column address provided to the bank logic circuit 1080 by the amount indicated by the ShiftCn signal.

While the example shown in FIG. 10 illustrates the shift logic circuit 1002 and the address shifter circuits 1004 as separate components, in other examples, the shift logic circuit 1002 and address shifter circuit 1004 may be combined into a single circuit.

Figure 11:
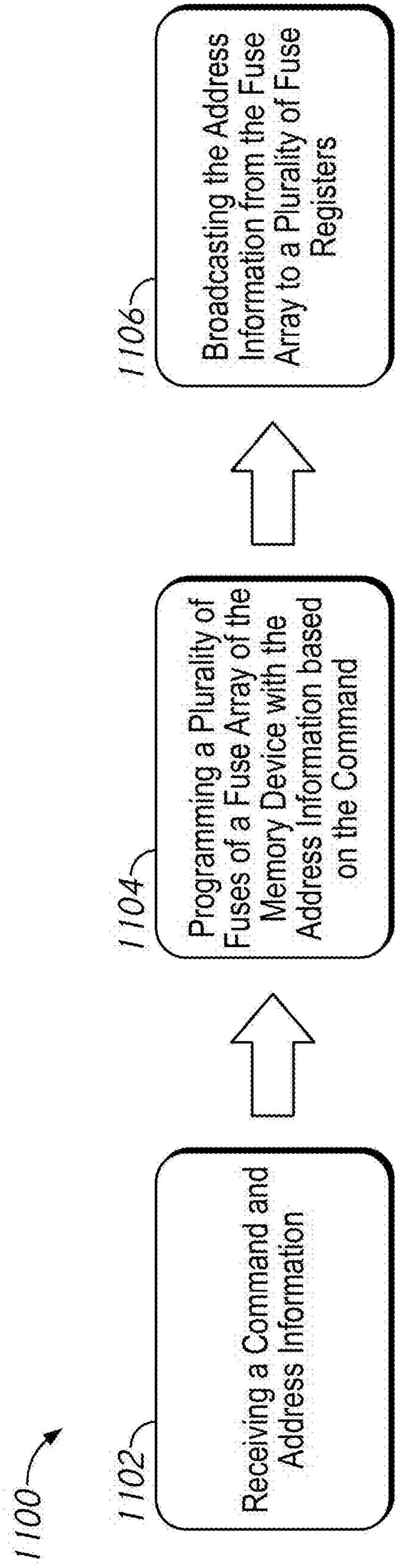
FIG. 11 a flow chart of a method according to some embodiments of the present disclosure.

FIG. 11 is a flow chart of a method according to some embodiments of the present disclosure. In some embodiments, the method in flowchart 1100 may be performed in whole or in part by memory devices 104, memory device 200, memory device 300, memory device 900, and/or memory device 1000.

At block 1102, "receiving a command and address information" may be performed. The command and address information may be received from an external device such as a testing device or a controller, such as controller 106 and/or controller 202.

At block 1104, "programming a plurality of fuses of a fuse array of the memory device with the address information based on the command" may be performed. The address information indicates a plurality of column selects remapped to a plurality of redundant column selects for a plurality of storage modes of the memory device.

At block 1106, "broadcasting the address information from the fuse array to a plurality of fuse registers" may be performed.

In some embodiments, such as the one shown in FIG. 9, the address information comprises an address and an amount to shift the address when the memory device is in a non-default storage mode of the plurality of storage modes. In these embodiments, the method shown in FIG. 11 may further include receiving a mode register write command and a value indicating a storage mode of the plurality of storage modes and writing the value to the mode register. When the storage mode is a default storage mode of the plurality of storage modes, the method may further include providing an inactive enable signal to disable an address shifter circuit, and when the storage mode is the non-default storage mode, providing an active enable signal to enable the address shifter circuit. The method may further include providing the address from the address shifter circuit when disabled and providing to a bank logic circuit a shifted address based on the amount to shift the address from the address shifter circuit when enabled.

In other embodiments, such as the one shown in FIG. 10, the method shown in flowchart 1100 may further include providing the address information to an address shifter circuit and a shift logic circuit, determining, with the shift logic circuit an amount to shift an address of the address information when the memory device is in a non-default storage mode of the plurality of storage modes, and providing a shift control signal from the shift logic circuit to the address shifter circuit indicating the amount. In some embodiments, the method may further include shifting the address shifted by the amount indicated by the shift control signal with the address shifter circuit and providing the address to the bank logic circuit. The method may further enabling, with a mode register, the shift logic circuit based on a storage mode of the plurality of storage modes. The method may further include storing an amount of metadata in the memory array based on the storage mode In the embodiments shown in FIGS. 1-11, redundancy information (e.g., column addresses) for all of the memory banks of the memory array are stored in a central fuse array, such as fuse array 225, fuse arrays 325*a-b*, fuse array 925, and fuse array 1025. In some embodiments, having a central fuse array may reduce die layout size and/or reduce "congestion" in the bank logic circuit regions of the memory array. However, in some applications, having separate fuse arrays for each bank, referred to as fuse banks, may be desirable. For example, having fuse banks may allow the reduction or elimination of broadcast operations. This may reduce initialization time and/or powerup time for the memory device.

In some embodiments where fuse banks are utilized, all of the addresses for all of the storage modes may be stored in the fuse banks (e.g., if there are three storage modes, three addresses are stored). However, similar to embodiments where fuses are utilized to store all of the addresses in the fuse array, a significant number of additional fuses may be needed, which may require additional die space. In some applications, the impact may be even greater for fuse banks than the fuse array given the scarcity of space near the memory banks. Accordingly, using an encoding scheme, such as the one shown in FIG. 6, may be desirable when fuse banks are utilized.

Figure 12:
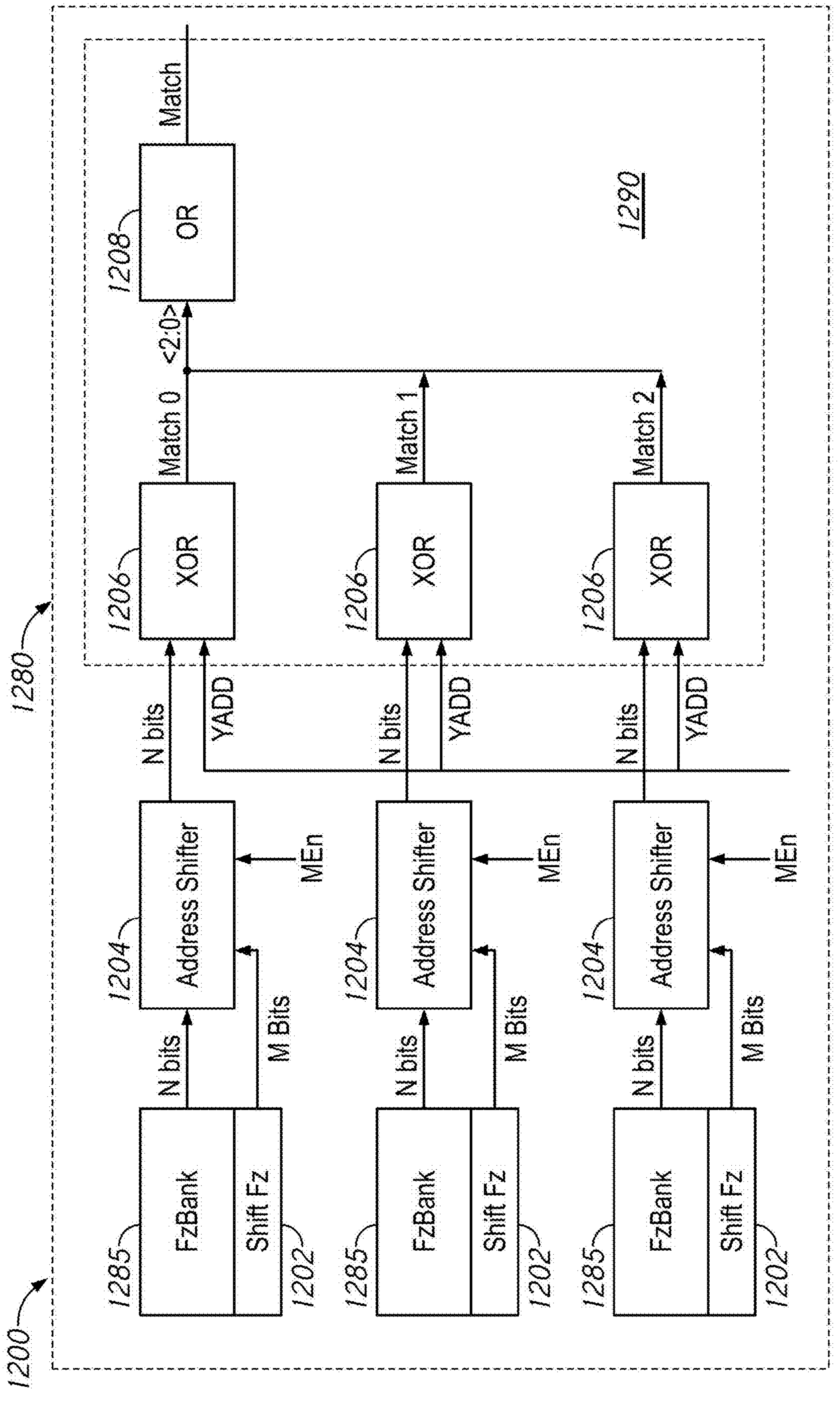
FIG. 12 is a block diagram representing at least a portion of a memory device according to some embodiments of the present disclosure.

FIG. 12 is a block diagram representing at least a portion of a memory device according to some embodiments of the present disclosure. The memory device 1200 may be included in a memory device similar to memory device 300, memory device 200, and/or memory devices 104 in some embodiments, except that the memory device 1200 includes fuse banks (FzBank) 1285 in addition to or instead of a fuse array (e.g., fuse array 225). The memory device 1200 may include bank logic circuit 1280. While only one bank logic circuit 1280 is shown, in some embodiments, separate bank logic circuits 1280 may be provided for each memory bank included in memory device 1200. The bank logic circuit 1280 may include the fuse banks 1285, address shifter circuits 1204, and matching circuit 1290.

The fuse banks 1285 may store column addresses for remapping logical addresses to redundant column selects when the "original" column selects are defective. The column addresses stored in the fuse banks 1285 may be for a default storage mode of the memory device 1200 (e.g., default column address). The fuse banks 1285 may include shift fuse banks (Shift Fz) 1202 that store address shift information. The address shift information may indicate how to shift the default column address to another address corresponding to a non-default storage mode. The address shift information stored in the shift fuse banks 1202 may use an encoding scheme, such as the encoding scheme described with reference to FIG. 4, in some embodiments. In some embodiments, the fuse banks 1285 may store N bits corresponding to a column address and the shift fuse banks 1202 may store M bits corresponding to the shift information. In some embodiments, N may equal 12 bits and M may equal 4 bits.

The fuse banks 1285 may provide column address information and shift information to the address shifter circuit 1204. The address shifter circuit 1204 may further receive an enable signal MEn from a mode register (not shown in FIG. 12). The mode register may be the similar or the same as mode register 275 in some embodiments. The MEn signal may disable the address shifter circuit 1204 when the memory device 1200 is in a default storage mode. When the address shifter circuit 1204 is disabled, the N bits of the column address are passed to the matching circuit 1290 without modification. When the memory device 1200 is in a non-default storage mode, the MEn signal may enable the address shifter circuit 1204 and may further indicate which non-default storage mode has been selected.

When enabled by MEn, the address shifter circuit 1204 may shift the column address provided by the fuse banks 1285 based on the M bits provided by the shift fuse banks 1202 of the fuse banks 1285. The indication of the selected non-default storage mode by the MEn signal may determine which of multiple shifts is performed by the address shifter circuit 1204. For example, when the encoding scheme described with reference to FIG. 4 is used, the address shifter circuit 1204 may shift the column address by an amount indicated by Bits<1:0> of the M bits when a first non-default storage mode is indicated by MEn and may shift the column address by an amount indicated by Bits<3:2> of the M bits when a second non-default storage mode is indicated by MEn. The shifted column address is provided from the address shifter circuit 1204 to the matching circuit 1290.

The matching circuit 1290 may include various logic circuits. In the example shown in FIG. 12, the matching circuit 1290 includes XOR logic circuits 1206 and an OR logic circuit 1208. In the example shown, the number of XOR logic circuits 1206 is equal to a number of fuse banks 1285. However, in other examples, alternative logic circuits may be used. Each XOR logic circuit 1206 receives the N bits from the corresponding address shifter circuit 1205 and a column address YADD. The column address YADD may be provided by an address decoder or a column decoder (not shown), such as address decoder 212 and column decoder 245. The XOR logic circuits 1206 each provide a match signal (Match 0-2) based on the column address provided by the address shifter circuit 1204 and the column address YADD. The OR logic circuit 1208 may receive the match signals from the XOR logic circuits 1206 and provide a final match signal Match. The Match signal indicates whether the column address YADD corresponds to an address that has been remapped to a redundant column select. When the column address YADD corresponds to a remapped address, the bank logic circuit 1280 may cause the appropriate redundant column select to be activated instead of the originally assigned column select.

Although not shown, in some embodiments, the bank logic circuit 1280 may include a shift logic circuit similar to shift logic circuit 1002 instead of storing the shift information in shift fuse banks 1202. In some applications, the logic circuits may have less layout impact than shift logic.

Figure 13:
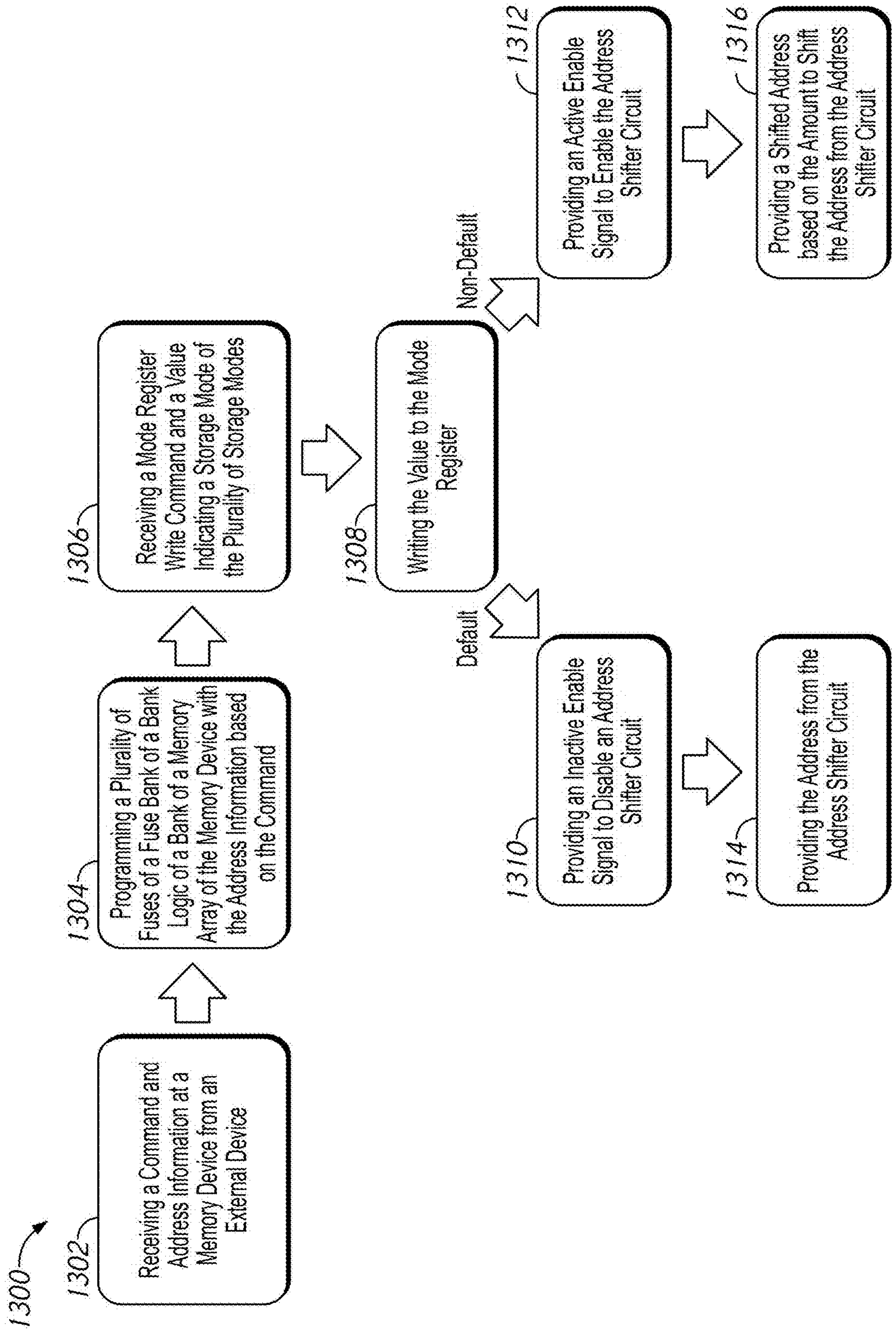
FIG. 13 a flow chart of a method according to some embodiments of the present disclosure.

FIG. 13 a flow chart of a method according to some embodiments of the present disclosure. The method shown in flowchart 1300 may be performed in whole or in part by a memory device such as memory device 1200.

At block 1302, "receiving a command and address information at a memory device from an external device" may be performed.

At block 1304, "programming a plurality of fuses of a fuse bank of a bank logic circuit of a bank of a memory array of the memory device with the address information based on the command" may be performed. The address information indicates a plurality of column selects remapped to a plurality of redundant column selects for a plurality of storage modes of the memory device. In some embodiments, programming comprises programming twelve fuses of the plurality of fuses to store an address and programming four fuses with an amount to shift the address.

In some embodiments, the address information comprises an address and an amount to shift the address when the memory device is in a non-default storage mode of the plurality of storage modes. In these embodiments, the method shown in flowchart 1300 may further include "receiving a mode register write command and a value indicating a storage mode of the plurality of storage modes" as indicated by block 1306, and "writing the value to the mode register" as indicated by block 1308. When the storage mode is a default storage mode of the plurality of storage modes, "providing an inactive enable signal to disable an address shifter circuit" may be performed as indicated by block 1310 and when the storage mode is the non-default storage mode, "providing an active enable signal to enable the address shifter circuit" may be performed as indicated by block 1312. The method may further include "providing the address from the address shifter circuit" as indicated by block 1314 when disabled and "providing a shifted address based on the amount to shift the address from the address shifter circuit" as indicated by block 1316 when enabled.

Optionally, method may further include comprising providing the address or shifted address to a matching circuit of the bank logic circuit. The method may further include providing a column address to the matching circuit. In some embodiments, the column address is provided from an address decoder. In some embodiments, column address is provided from a column decoder.

The apparatuses, systems, and methods disclosed herein may provide for memory devices with multiple storage modes with redundancy capabilities for all of the storage modes. That is, the memory devices may correctly map logical addresses to physical addresses of redundant memory lines (e.g., column selects) for memory lines that have been remapped to the redundant memory lines. Some of the disclosed embodiments may use encoding of address shifts to provide remapping for the storage modes. In some applications, this may minimize the amount of additional fuses required. Some of the disclosed embodiments may utilize shift logic circuitry, which may require less layout space than fuses in some applications.

The above discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

a memory array configured to be arranged based on one of a plurality of storage modes, wherein the memory array comprises a plurality of column selects and a plurality of redundant column selects;

a fuse array comprising a plurality of fuses, wherein the plurality of fuses are configured to be programmed to store address information for a portion of the plurality of column selects remapped to the plurality of redundant column selects for the plurality of storage modes;

a plurality of fuse registers configured to receive the address information from the fuse array during a broadcast operation; and a mode register configured to initiate the broadcast operation responsive to a mode register write command.

2. The apparatus of claim 1, wherein the mode register write command changes a storage mode of the memory array.

3. The apparatus of claim 1, wherein the mode register is configured to store a value indicating a storage mode of the plurality of storage modes.

4. The apparatus of claim 1, further comprising a controller configured to provide the mode register write command to the mode register.

5. The apparatus of claim 1, wherein each of the plurality of storage modes cause the memory array to store different amounts of metadata.

6. The apparatus of claim 1, further comprising a fuse logic circuit configured to provide the address information to the plurality of fuse registers from the fuse array.

7. The apparatus of claim 6, wherein the plurality of fuses comprises a latch, a flip-flop, or a combination thereof.

8. The apparatus of claim 1, further comprising a fuse bus coupling the fuse array and the plurality of fuse registers.

9. A method comprising:

receiving a mode register write command and a value at a memory device;

responsive to the mode register write command, writing the value to a mode register, wherein the value indicates a storage mode of a plurality of storage modes, wherein writing the value changes the storage mode of the memory device; and initiating a broadcast operation responsive to writing the value to the mode register.

10. The method of claim 9, further comprising, responsive to initiating the broadcast operation, providing address information from a fuse array to a plurality of fuse registers.

11. The method of claim 10, wherein the address information comprises address information for a portion of a plurality of column selects remapped to a plurality of redundant column selects for the storage mode of the plurality of storage modes.

12. The method of claim 10, wherein providing the address information from the fuse array to the plurality of fuse registers comprises providing the address information from the fuse array to a fuse logic circuit and providing the address information from the fuse logic circuit to the plurality of fuse registers.

13. The method of claim 10, wherein one of the plurality of storage modes is a default storage mode.

14. The method of claim 13, further comprising:

powering up the memory device;

initiating a first broadcast operation; and providing the address information for the default storage mode from the fuse array to the plurality of fuse registers, wherein the above steps are performed prior to the steps of claim 9.

15. The method of claim 9, further comprising operating the memory device in the storage mode indicated by the value.

16. A method comprising:

providing a mode register write command and a value from a controller to a memory device to change from a first storage mode to a second storage mode of a plurality of storage modes of the memory device, wherein changing from the first storage mode to the second storage mode causes the memory device to initiate a broadcast operation.

17. The method of claim 16, further comprising providing data, metadata, or a combination thereof in accordance with the second storage mode.

18. The method of claim 17, waiting a period of time between providing the mode register write command and providing the data, the metadata, or the combination thereof.

19. The method of claim 16, further comprising initializing the memory device.

20. The method of claim 16, wherein the first storage mode is a default storage mode of the plurality of storage modes.

* * * * *